United States Patent
Do (10) Patent No.: US 7,602,492 B2
(45) Date of Patent: Oct. 13, 2009

(54) OVERLAY MEASURING METHOD AND RELATED SEMICONDUCTOR FABRICATION EQUIPMENT MANAGEMENT SYSTEM

(75) Inventor: Byung-Hun Do, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 276 days.

(21) Appl. No.: 11/656,436

(22) Filed: Jan. 23, 2007

(65) Prior Publication Data

US 2008/0002875 A1    Jan. 3, 2008

(30) Foreign Application Priority Data

Jun. 30, 2006    (KR)    ................. 10-2006-0060482

(51) Int. Cl.
G01B 11/00    (2006.01)
G01B 11/14    (2006.01)

(52) U.S. Cl. ...................... 356/401; 356/614
(58) Field of Classification Search ............... None
See application file for complete search history.

(56) References Cited

U.S. PATENT DOCUMENTS

| | | | |
|---|---|---|---|
| 5,696,835 A | 12/1997 | Hennessey et al. | |
| 6,357,131 B1 | 3/2002 | Cheng et al. | |
| 6,363,168 B1 | 3/2002 | Kakuma | |
| 6,436,594 B2 | 8/2002 | Tokunaga | |
| 6,737,208 B1 | 5/2004 | Bode et al. | |
| 6,815,232 B2 | 11/2004 | Jones et al. | |
| 6,906,780 B1* | 6/2005 | Smith | 355/52 |
| 6,908,775 B2 | 6/2005 | Heine et al. | |
| 2004/0030430 A1 | 2/2004 | Matsuoka | |
| 2006/0072086 A1* | 4/2006 | Kim | 355/52 |
| 2007/0133861 A1* | 6/2007 | Do | 382/149 |
| 2008/0023855 A1* | 1/2008 | Ghinovker et al. | 257/797 |

FOREIGN PATENT DOCUMENTS

| | | | |
|---|---|---|---|
| KR | 2003016458 A | * | 3/2003 |
| KR | 2006043963 A | * | 5/2006 |

* cited by examiner

*Primary Examiner*—Michael A Lyons
*Assistant Examiner*—Gordon J Stock, Jr.
(74) *Attorney, Agent, or Firm*—Volentine & Whitt, PLLC (57) ABSTRACT

Embodiments of the invention provide an overlay measuring method and a semiconductor fabrication equipment management system adapted to perform the method. In one embodiment, the method comprises setting a map corresponding to a wafer using a measuring apparatus computer and a reference recipe output from a host computer, inputting setup data comprising a setup position and an allowable range corresponding to the setup position to the measuring apparatus computer, recognizing and measuring a position of a center of the wafer, and recognizing and measuring a position of a wafer alignment mark. The method further comprises inputting measurement data comprising a measured position of a wafer overlay mark to the measuring apparatus computer, comparing the measurement data with the setup data, and outputting an interlock control signal from the measuring apparatus computer if the measured position of the wafer overlay mark is outside of the allowable range.

13 Claims, 5 Drawing Sheets

Selected Tests:

| # | Name | Optimization | Status | TIS | AR | X | Y | O | OK |
|---|------|--------------|--------|-----|-----|---|---|---|-----|
| 1 | df110_1 | Both Axes | Normal... | ↻ | ☒ | 6.6306 | 15.3542 | LL | O |
| 2 | df110_2 | Both Axes | Parent | ↻ | ☒ | 0.0266 | 29.6593 | LL | O |
| 3 | df110_3 | Both Axes | Normal... | ↻ | ☒ | 14.1788 | 29.6288 | LL | X |
| 4 | df110_4 | Both Axes | Normal... | ↻ | ☒ | 14.1783 | 1.0331 | LL | O |
| 5 | df110_5 | Both Axes | Normal... | ↻ | ☒ | 0.0233 | 1.0034 | LL | O |

OVERLAY MEASURING METHOD AND RELATED SEMICONDUCTOR FABRICATION EQUIPMENT MANAGEMENT SYSTEM

BACKGROUND

1. Technical Field

Embodiments of the invention relate to a method for use in semiconductor fabrication and a related apparatus adapted for use in semiconductor fabrication. In particular, embodiments of the invention relate to an overlay measuring method and a semiconductor fabrication equipment management system adapted to perform the overlay measuring method.

This application claims priority to Korean Patent Application No. 10-2006-0060482, filed Jun. 30, 2006, the subject matter of which is hereby incorporated by reference in its entirety.

2. Discussion of Related Art

Recently, the rapid spread of information technology such as computers has generated a demand for the development of new semiconductor devices having relatively high operation speeds and relatively high storage capacities. Accordingly, semiconductor devices having relatively high degrees of integration, relatively high levels of reliability, and relatively high operation speeds have been developed.

In the semiconductor industry, unit processes used in the fabrication of semiconductor devices are being developed with the goal of ensuring high yield rate and throughput for each of the unit processes, and research is being conducted on methods and apparatuses for detecting (i.e., measuring) process errors in individual unit processes. In particular, photolithography processes, which are essential to the fabrication of a semiconductor device, require compensation for frequent variations in process conditions and apparatuses for making those compensations.

One substantial problem for photolithography processes is the misalignment of photoresist patterns formed through exposure and development. In addition, accurate alignment becomes increasingly difficult as wafer size increases, the number of photolithography processes performed increases, and alignment margins decrease due to increasing demand for semiconductor devices having higher integration densities. In order to prevent the misalignment of photoresist patterns, an overlay measuring process needs to be optimized to check the alignment conditions of photoresist patterns already formed on a wafer.

U.S. Pat. Nos. 5,696,835 and 6,357,131 disclose methods for performing an optimized overlay measuring process.

A conventional overlay measuring method will now be described. In a conventional overlay measuring method, a reference recipe that includes information concerning chip pattern images formed on a reticle in an exposure unit used in forming photoresist patterns on a wafer is required in order to make an overlay measurement of the wafer. A host computer that controls an apparatus computer in an overlay measuring apparatus outputs the reference recipe. The overlay measuring apparatus uses the reference recipe output from the host computer to set a map that corresponds to a plurality of chip patterns formed on the wafer. The number of the chip patterns may depend on the size of the wafer or the size of the chip patterns formed on the wafer. For example, about 77 (5×), 44, or 17 (25×) chip patterns may be formed on an 8-inch wafer.

When an overlay measuring process comprising a preliminary overlay measuring process and an overlay evaluation process is performed on the wafer on which the chip patterns are formed, the apparatus computer needs to set a map using a reference recipe having images that correspond to the chip patterns. If an incorrect reference recipe is input to the apparatus computer by mistake, the apparatus computer will set a map based on the incorrect reference recipe and perform an overlay measuring process using (i.e., based on) the map, which may result in overlay measurement errors in the overlay evaluation process (i.e., may generate erroneous results).

An overlay mark on which an overlay evaluation process (i.e., a substantive overlay measuring process) is performed represents a correlation between thin films that have been formed on the wafer. Since there are various kinds of overlay marks, it is not possible to provide position information for a specific overlay mark when setting up the map. Accordingly, the overlay evaluation process is performed on the overlay mark after an operator manually selects and records position information corresponding to the overlay mark. However, the operator may input incorrect position information for the overlay mark to the apparatus computer, which may cause overlay measurement errors (i.e., produce erroneous results) in the overlay evaluation process.

The apparatus computer uses an optical unit of the overlay measuring apparatus to measure the relative positions of (i.e., an overlapped position between) an upper photoresist pattern formed on the wafer (which may be referred to hereinafter as a "son ruler") and a lower photoresist pattern (which may be referred to hereinafter as a "mother ruler") that is disposed at least one layer below the upper photoresist pattern. It is difficult to make an overlay measurement (i.e., evaluation) of the layer patterns formed in individual chip areas of the wafer because the layer patterns are very complex. Accordingly, the overlay evaluation process may be performed using a scribe line formed on a portion of the wafer disposed outside of the chip area of the wafer and an additional overlay mark formed at the center of the chip area.

In more detail, the overlay measuring process is performed according to a predetermined ratio according to the number of shots which are provided on a single wafer, or the size of the wafer. In addition, the overlay evaluation process is performed on the entire wafer by sequentially performing the overlay evaluation process on various portions of the wafer using the optical unit of the overlay measuring apparatus. The apparatus computer that controls the overlay measuring apparatus enables the optical unit to set alignment marks as reference points and to measure (i.e., evaluate) the overlay mark at increasing magnifications.

When a wafer is provided to the overlay measuring apparatus after photolithography has been performed on the wafer, the apparatus computer controls the overlay measuring apparatus such that the overlay measuring apparatus recognizes a central position of the wafer and a lens of the optical unit magnifies the central position of the wafer to measure an overlay mark on the wafer. The optical unit is controlled to magnify a pattern with a size of about 12 mm (12K) and to acquire an image of the pattern.

The lens of the optical unit is controlled to find and magnify a wafer alignment mark that has the shape of a cross ("+"), is separated from the center of the wafer by a predetermined distance, and is formed on a boundary of a plurality of chip areas. As an example, the central position of the alignment mark may be set as a shot reference point and can be measured at a magnification where an image of a pattern having a size of about 750 µm is acquired by the lens of the optical unit. At this time, the optical unit finds the alignment mark (i.e., the shot reference point) disposed proximate the center of the wafer in accordance with a control signal output by the apparatus computer and based on the map, and then magnifies and projects the surface of the wafer. At this time, the alignment mark (i.e., shot reference point) may be set such that it is a reference point having coordinates (0, 0) and is disposed at a lower-left (LL) portion of one of the chip areas.

The lens of the optical unit is controlled to magnify and project an overlay mark that is separated from the central position of the alignment mark by a predetermined distance. The overlay mark includes a mother ruler, a son ruler, and a label. The mother ruler is formed on a lower pattern layer that is patterned on the wafer by a first semiconductor fabrication process. The son ruler is formed above the mother ruler by a second semiconductor fabrication process after the first semiconductor fabrication process, and is formed such that it overlaps with the mother ruler and is separated from the mother ruler by a predetermined distance in a direction that is substantially perpendicular with the working surface of the wafer. The label is formed in the same layer as either the mother ruler or the son ruler and comprises a name that identifies during which semiconductor fabrication processes the mother and son rulers were formed, respectively. The label may include information about various layers formed sequentially on the wafer. For example, a label "40 TO 10" indicates an overlay mark that is measured to calculate an overlay compensation value between the fourth layer formed on the wafer and the first layer formed on the wafer.

A plurality of overlay marks, each having a specific identification name (i.e., label), are formed adjacent to the center and adjacent to corners of the chip area, respectively. Accordingly, at an early stage of the overlay measuring process (i.e., during the preliminary overlay measuring process), an operator selects overlay marks and inputs measurement data for the selected overlay marks, each of which is separated from the alignment mark (i.e., shot reference point). The measurement data is provided to the apparatus computer so that the apparatus computer can perform the subsequent overlay evaluation process in accordance with the measurement data received at the early stage of the overlay measuring process (i.e., during the preliminary overlay measuring process).

Thus, in accordance with the conventional overlay measuring method, when incorrect measurement data corresponding to a position of an overlay mark is input to the apparatus computer by an operator during the preliminary overlay measuring process, erroneous results may be returned (i.e., overlay measurement errors may occur), which may result in accidents on semiconductor production lines.

SUMMARY OF THE INVENTION

Therefore, the present invention is directed to provide an overlay measuring method that reduces the number of erroneous results produced by an overlay evaluation process after incorrect measurement data corresponding to a position of an overlay mark is input by an operator to an apparatus computer during a preliminary overlay measuring process to thereby improve the productivity of a semiconductor fabrication process.

In one embodiment, the invention provides an overlay measuring method comprising setting a map corresponding to a wafer using a measuring apparatus computer and a reference recipe output from a host computer; inputting setup data comprising a setup position and an allowable range corresponding to the setup position to the measuring apparatus computer, wherein the setup position is obtained from reticle information; and recognizing and measuring a position of a center of the wafer using an optical unit connected to the measuring apparatus computer. The method further comprises recognizing and measuring a position of a wafer alignment mark using the optical unit, wherein the wafer alignment mark is formed on a boundary of a plurality of chips formed on the wafer and the position of the center of the wafer and the position of the wafer alignment mark are defined relative to the map; inputting measurement data comprising a measured position of a wafer overlay mark to the measuring apparatus computer, wherein the wafer overlay mark is separated from the wafer alignment mark; comparing the measurement data with the setup data; and outputting an interlock control signal from the measuring apparatus computer if the measured position of the wafer overlay mark is outside of the allowable range.

In another embodiment, the invention provides an overlay measuring method comprising outputting a reference recipe from a host computer; using a measuring apparatus computer to set a map corresponding to a wafer using the reference recipe received from the host computer; and inputting setup data comprising a setup position and an allowable range corresponding to the setup position to the measuring apparatus computer, wherein the setup position is obtained from reticle information. The method further comprises aligning the wafer on a wafer stage of an overlay measuring apparatus comprising an optical unit; recognizing and measuring a position of the center of the wafer defined relative to the map using the optical unit; and recognizing and measuring a position of a wafer alignment mark formed on a boundary of a first plurality of chips formed on the wafer and disposed proximate the center of the wafer. The method still further comprises inputting measurement data comprising a measured position of a wafer overlay mark to the measuring apparatus computer, wherein the wafer overlay mark is separated from the wafer alignment mark; comparing the measurement data with the setup data; and outputting an interlock control signal from the measuring apparatus computer if the measured position of the wafer overlay mark is outside of the allowable range.

In yet another embodiment, the invention provides a management system for semiconductor fabrication equipment comprising an overlay measuring apparatus adapted to perform an overlay evaluation process to calculate a compensation value for a wafer overlay mark formed on a wafer and adapted to measure a position of the wafer overlay mark; a host computer comprising a database and adapted to output from the database information used in controlling the overlay measuring apparatus; and, a measuring apparatus computer electrically connected between the host computer and the overlay measuring apparatus and adapted to compare the measured position of the wafer overlay mark with setup data and output an interlock control signal if the measured position of the overlay mark is outside of an allowable range. In the management system, the setup data comprises a setup position and the allowable range, the setup position is based on reticle information and is received from the host computer or an operator, and the allowable range corresponds to the setup position.

BRIEF DESCRIPTION OF THE DRAWINGS

Embodiments of the invention will be described herein with reference to the accompanying drawings, in which like reference symbols indicate like or similar elements throughout. In the drawings.

Figure (FIG.) 1 shows a block diagram of a semiconductor fabrication equipment management system in accordance with an embodiment of the invention.

DESCRIPTION OF EMBODIMENTS

Figure 1:
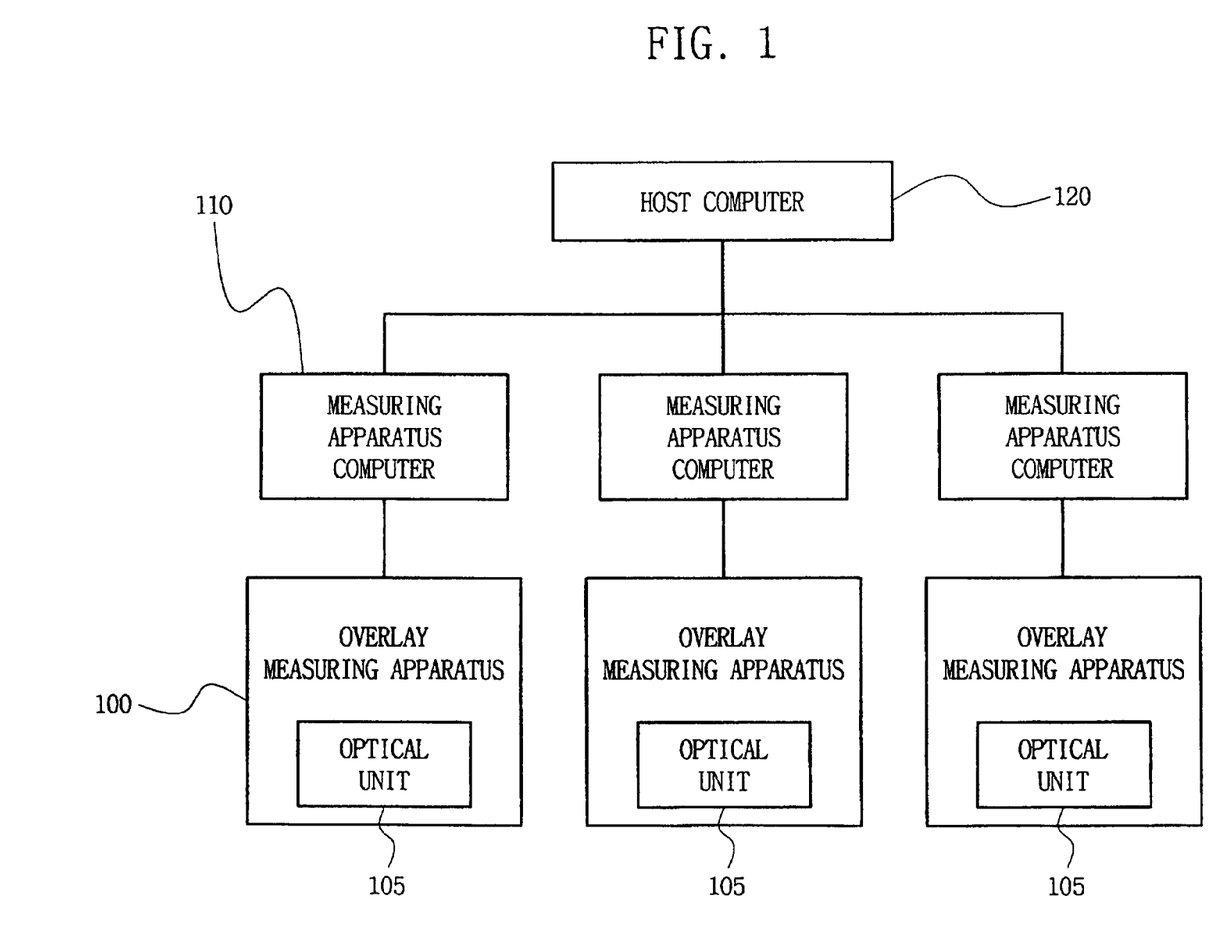

FIG. 1 shows a block diagram of a semiconductor fabrication equipment management system in accordance with an embodiment of the invention.

The semiconductor fabrication equipment management system comprises overlay measuring apparatuses 100, a host computer 120, and measuring apparatus computers 110. Though multiple overlay measuring apparatuses 100, measuring apparatus computers 110, and optical units 105 are shown in FIG. 1, for convenience of description, only one overlay measuring apparatus 100, one measuring apparatus computer 110, and one optical unit 105 will generally be described herein. Overlay measuring apparatus 100 is adapted to perform an overlay evaluation process to calculate a compensation value for each wafer overlay mark (130 of FIG. 4) of a plurality of wafer overlay marks 130, which are formed on a wafer. Host computer 120 comprises a database to provide information required to control overlay measuring apparatus 100. Measuring apparatus computer 110 is electrically connected between host computer 120 and overlay measuring apparatus 100 and compares setup data with measurement data. Setup data, which is based on reticle information, is provided to measuring apparatus computer 110 by host computer 120 or an operator, and the setup data comprises a setup position and an allowable range corresponding to the setup position. The setup position corresponds to a position of a reticle overlay mark formed in a reticle of an exposure unit, wherein the reticle overlay mark corresponds to at least a portion of a wafer overlay mark 130 formed on the wafer. As used herein, a wafer overlay mark 130 is an overlay mark that is formed on a wafer and a reticle overlay mark is formed in a reticle and corresponds to at least a portion of a wafer overlay mark 130. Also, as used herein, a wafer alignment mark is an alignment mark that is formed on a wafer and a reticle alignment mark is an alignment mark that is formed in a reticle and corresponds to the wafer alignment mark. Overlay measuring apparatus 100 measures the position of the wafer overlay mark 130, which corresponds to the reticle overlay mark, and the measurement data comprises the measured position of wafer overlay mark 130. In addition, if the measured position of wafer overlay mark 130 of the measurement data is outside of the allowable range of the setup data, then measuring apparatus computer 110 outputs an interlock control signal to prevent overlay measuring apparatus 100 from performing an overlay evaluation process using the current measurement data.

Although not shown, the semiconductor fabrication equipment management system may be implemented using a computer and/or a server. The RDM computer is electrically connected to host computer 120 so that an operator may input to or receive from host computer 120 information concerning the semiconductor fabrication process. The RDM computer also transmits to measuring apparatus computer 110 a simulated overlay measuring method that is performed by overlay measuring apparatus 100. The server connects measuring apparatus computer 110, host computer 120, and the RDM computer.

Overlay measuring apparatus 100 is adapted to measure a central position of a wafer overlay mark 130, comprising a mother ruler (132 of FIG. 4) and a son ruler (134 of FIG. 4), so that a semiconductor fabrication process (i.e., a patterning process) can be monitored. The mother ruler is patterned during a first process and the son ruler is patterned during a second process performed after the first process. Overlay measuring apparatus 100 may, for example, comprise a wafer stage and an optical unit 105. The wafer stage arranges a wafer to have a specific orientation, supports the wafer on which wafer overlay mark 130 is formed, and moves the wafer to a predetermined position in a horizontal direction. Optical unit 105 magnifies and projects wafer overlay mark 130 to acquire a pattern image that corresponds to wafer overlay mark 130. Optical unit 105 comprises a plurality of lenses and a camera. A lens is used by optical unit 105 to magnify wafer overlay mark 130, which optical unit 105 then projects, and the camera then acquires a pattern image of wafer overlay mark 130 that is magnified and projected through the lens.

Measuring apparatus computer 110 uses the pattern image corresponding to wafer overlay mark 130 and acquired by optical unit 105 of overlay measuring apparatus 100 to determine whether or not a corresponding semiconductor process performed on the wafer has been performed normally. Further, measuring apparatus computer 110 uses wafer overlay mark 130 to calculate an overlay compensation value so that a process condition for the semiconductor process can be reset or modified before the process is performed on another wafer. Measuring apparatus computer 110 shares or exchanges data with the server using the semiconductor equipment communications standard (SECS). The server exchanges data with host computer 120 using transmission control protocol/internet protocol (TCP/IP). In one example, measuring apparatus computer 110 comprises a central processing unit, a storage unit, an input unit, and an output unit. The central processing unit executes instructions or operations. The storage unit stores programs and input data corresponding to the instructions or operations which are executed by the central processing unit. The input unit is adapted to provide input data through the central processing unit to the storage unit and is adapted to input control signals it has received so that the instructions or operations can be executed by the central processing unit. The output unit is adapted to output signals from the central processing unit. The central processing unit is a core unit that generally controls the computer so that it processes input data received from the input unit and stores resultant data into the storage unit or outputs the resultant data to the output unit. That is, the central processing unit generally controls the operation of measuring apparatus computer 110. In a compact computer, the central processing unit (CPU) is also called a microprocessor. Microprocessors may be divided into two types in accordance with their instruction set: complex instruction set computer (CISC) and reduced instruction set computer (RISC). A CISC provides various forms of the instructions through microprogramming, but has a complex structure and has a relatively high production cost. On the other hand, a RISC has simple control logic to improve its operation speed, is inexpensive compared to the CISC, and is mainly used in workstations. The CPU comprises an arithmetic logic unit, which is responsible for comparison, determination, and operation; and a control unit, which is responsible for interpretation and execution of the instructions. The arithmetic logic unit comprises an adder that performs addition operations, an accumulator that temporarily stores data obtained through arithmetic and logical operations, and a register that is a temporary storage unit. The control unit comprises a program counter that controls the sequence of instructions to be executed, an instruction register that temporarily stores instructions that are currently being executed, and an instruction decoder that decodes the instructions stored in the instruction register and sends a control signal to another unit to execute the instructions. The CPU or microprocessor transfers data or control signals through a bus. Busses may be divided into 8-bit, 16-bit, 32-bit, and 64-bit busses in accordance with the number of bits they transmit. A PENTIUM computer typically has an internal bus with a size of 64 bits. On a semiconductor production line, measuring apparatus computer 110 comprises a CPU having more than 32 bits so that operators can readily monitor the overlay measuring process through a display unit.

The storage unit is divided into main memory and auxiliary memory. When the CPU executes operations, main memory is used to store and execute program or input data that is loaded from the auxiliary memory. Main memory comprises a program area to store the program, an input area to store the input data, an output area to store output data, and a working area to store non-final data. Main memory generally uses a semiconductor memory unit such as a read-only memory (ROM) device or a random access memory (RAM) device. ROM is non-volatile memory and examples of ROM include mask ROM, programmable ROM (PROM), and erasable programmable ROM (EPROM). RAM is volatile memory and examples of RAM include static RAM (SRAM) and dynamic RAM (DRAM). An SRAM device retains data stored therein as long as power continues being applied to the SRAM device, unlike DRAM, which needs to be periodically refreshed. Auxiliary memory is an external storage unit adapted to store programs or data and retain stored data even when power is not supplied to it. Main memory has relatively high operating speed but is relatively expensive and loses data stored therein when power is no longer supplied to it. On the other hand, auxiliary memory has relatively low operating speed but can retain a relatively large amount of data even when power is not supplied to it. The program stored in the auxiliary memory may be a VISUAL BASIC program for controlling overlay measuring apparatus 100.

The input and output units are a set of units that exchange information between the computer and an operator or user. In order to process data using the computer, the data needs to be input to the computer through the input unit and then output through the output unit so that the operator or user can read it. Accordingly, the input unit converts data into a computer-readable form and loads it to main memory through the CPU. In addition, the output unit converts data into characters or figures that can be identified by a user. Examples of the input unit include a card reader, optical character recognition (OCR), optical mark recognition (OMR), a barcode reader, magnetic-ink character recognition, a keyboard, a scanner, a voice input unit, a write-pen, a touch screen, a joy stick, a mouse, and a digitizer. Examples of the output unit include display unit such as a CRT or LCD monitor, a printer, a voice synthesizer, a plotter, and a voice response unit. The input and output units are controlled by input and output control software, respectively, and may be collectively defined as an input/output system. Overlay measuring apparatus 100 may comprise the output unit.

Measuring apparatus computer 110 performs a map setup process (e.g., a mapping process) using a reference recipe input to measuring apparatus computer 110 through host computer 120 so that the respective positions of a plurality of chips formed on the wafer can be read. When the map is set up, a center coordinate (i.e., a central coordinate) of the wafer is set, and a shot reference point corresponding to a boundary of a plurality of chips, which is separated from the central coordinate of the wafer by a predetermined distance, is also set. The shot reference point may, for example, be set such that the shot reference point is disposed at a lower-left (LL) part of the chip is set as a reference point having the coordinates (0, 0), and a wafer alignment mark may be formed on the shot reference point. Measuring apparatus computer 110 may be configured such that an active screen appears on a WINDOWS screen used in the mapping process or on another WINDOWS screen. In addition, an operator may input setup data read from reticle information to measuring apparatus computer 110, wherein the setup data comprises a setup position (i.e., coordinate) corresponding to a position of a reticle overlay mark, wherein the reticle overlay mark corresponds to at least a portion of a wafer overlay mark 130 that is separated by a predetermined distance from the wafer alignment mark (i.e., the shot reference point). In addition, the setup position may be defined relative to a position of a reticle alignment mark formed in a reticle of an exposure unit and corresponding to the wafer alignment mark. The setup data may be input on the active screen, and the setup data that is input on the active screen comprises a setup position, which is an accurate position (i.e., accurate coordinates) for wafer overlay mark 130, and may also comprise an allowable range corresponding to the setup position.

After overlay measuring apparatus 100 sequentially measures the center position of the wafer and the position of a wafer alignment mark (which is formed on the shot reference point), an operator inputs measurement data comprising the measured position of wafer overlay mark 130, which is separated from the wafer alignment mark (i.e., the shot reference point) by a predetermined distance, to measuring apparatus computer 110. Ideally, the coordinates of the measured position of the measurement data and the coordinates of the setup position of the setup data should be the same, but those positions may be different as a result of variations in one or more process condition(s) used to form wafer overlay mark 130 or an overlay measurement condition related to overlay measuring apparatus 100. Accordingly, the measurement data should comprise a measured position that is the same as the setup position of the setup data or that is within an allowable range of the setup position, as specified in the setup data. As used herein, a measured position is "within the allowable range" corresponding to the setup position when each coordinate of the measured position is within the allowable range for the corresponding coordinate of the setup position, including when at least one of the coordinates of the measured position is equal to the corresponding coordinate of the setup position.

However, when an operator inputs setup data, the operator may not specify a predetermined wafer overlay mark 130 on which the overlay evaluation process will be performed, but may specify a different wafer overlay mark 130 through overlay measuring apparatus 100. When that occurs, measuring apparatus computer 110 determines that the measured position of the measurement data is not the same as the setup position of the setup data and each coordinate of the measured position is outside of the allowable range for the corresponding coordinate of the setup position of the setup data and outputs an interlock control signal to overlay measuring apparatus 100. Each "position" described herein corresponds to a pair of coordinates corresponding to a two-dimensional coordinate plane.

Thus, in accordance with an embodiment of the invention, in the semiconductor fabrication equipment management system illustrated in FIG. 1, setup data comprising the position of a wafer overlay mark 130 based on reticle information is input when setting up a map in measuring apparatus computer 110. Also, after acquiring measurement data comprising a measured position of wafer overlay mark 130 through a preliminary overlay measuring process, the management system compares the setup data with the measurement data and, if the measurement data (i.e., a measured position of the measurement data) is outside of an allowable range of the setup data, the management system outputs the interlock control signal to prevent an overlay evaluation process from being performed using the current measurement data. Accordingly, it is possible to reduce the number of erroneous results obtained from an overlay evaluation process and improve the productivity of a semiconductor device fabrication process.

An overlay measuring method using the semiconductor fabrication equipment management system described with reference to FIG. 1 will now be described.

Figure 2:
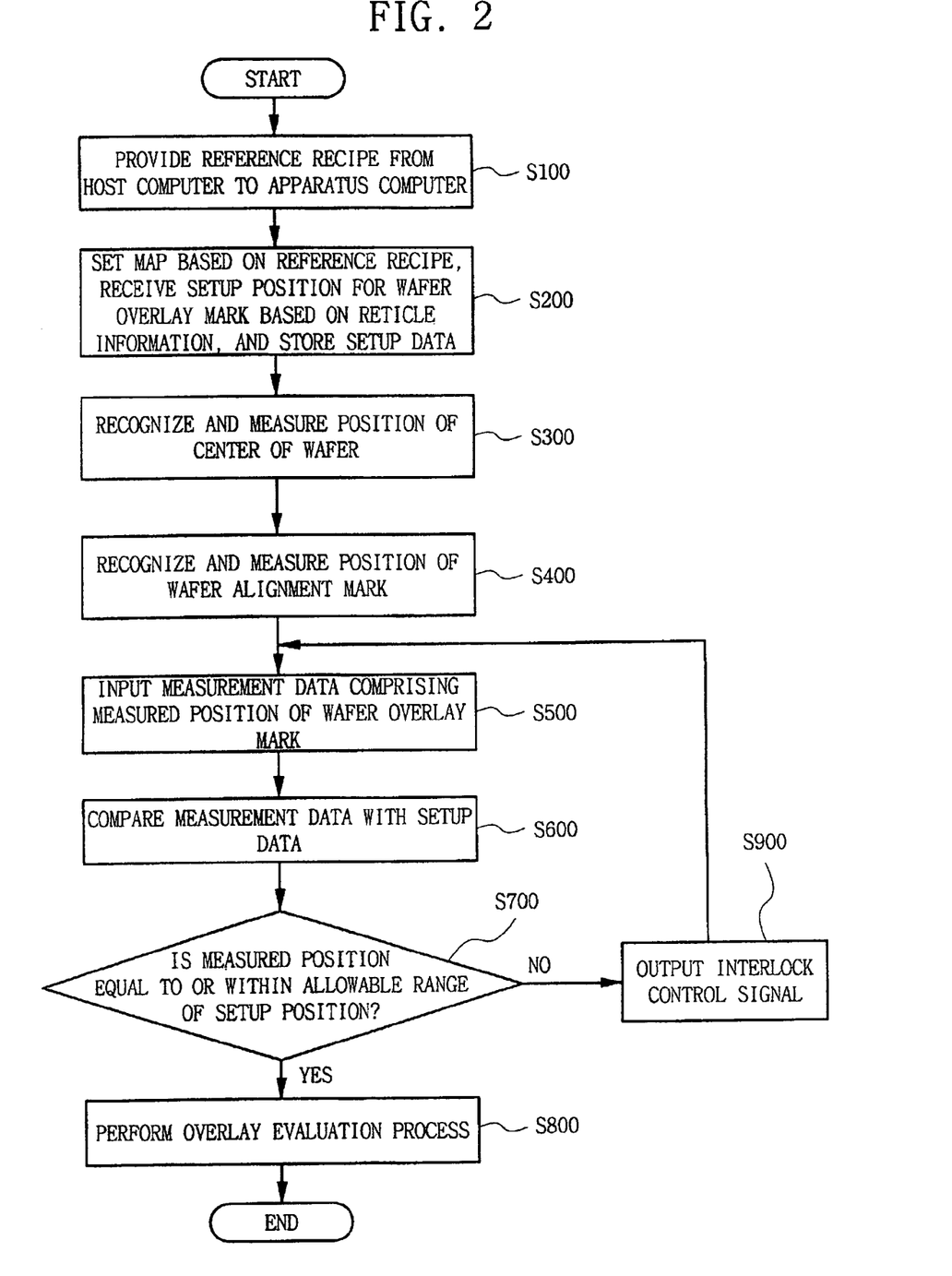
FIG. 2 shows a flow chart of an overlay measuring method in accordance with an embodiment of the invention.
Figure 3:
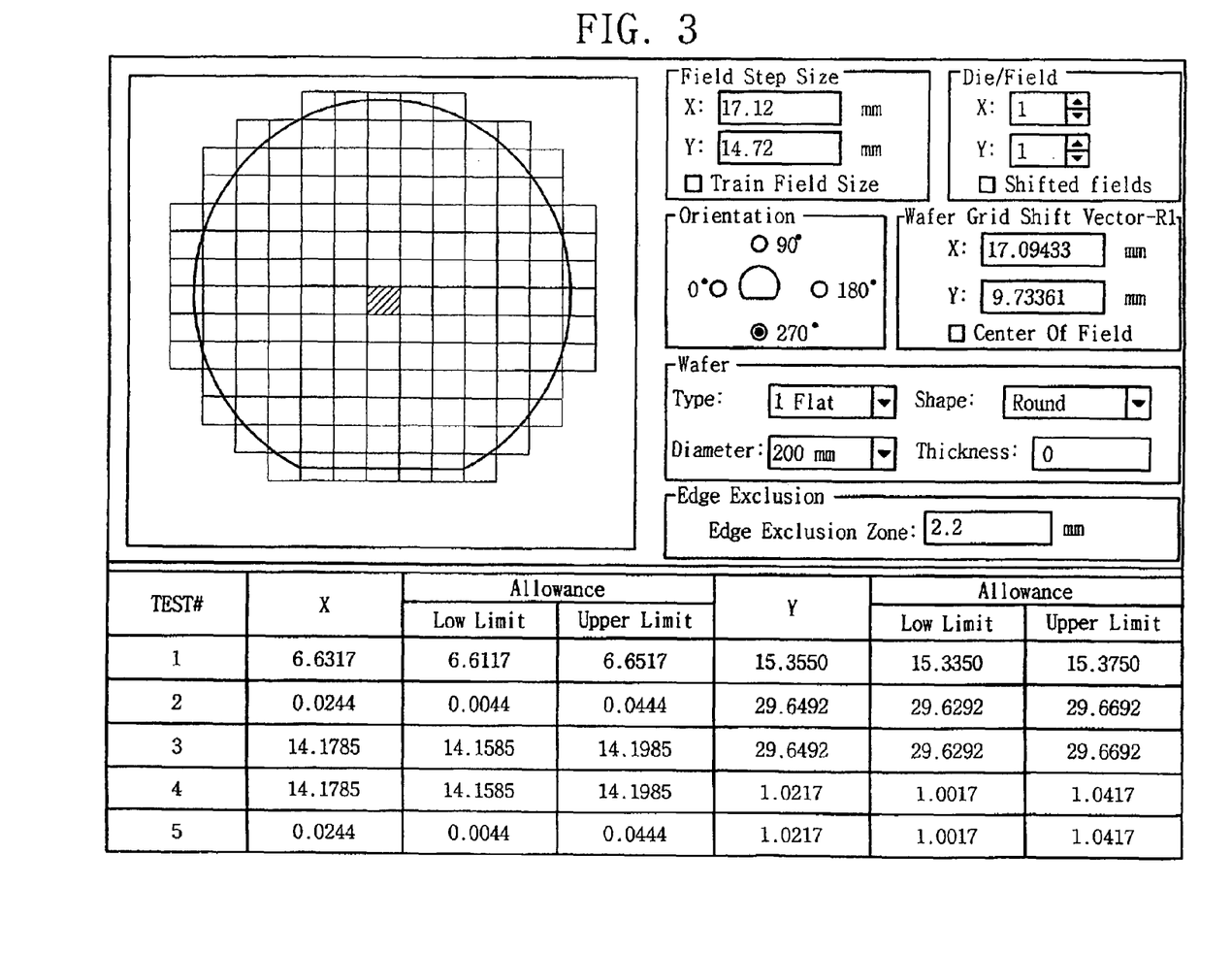
FIG. 3 shows a screen that is displayed on an output unit of an apparatus computer when setting up a map when performing the method of FIG. 2.
Figure 4:
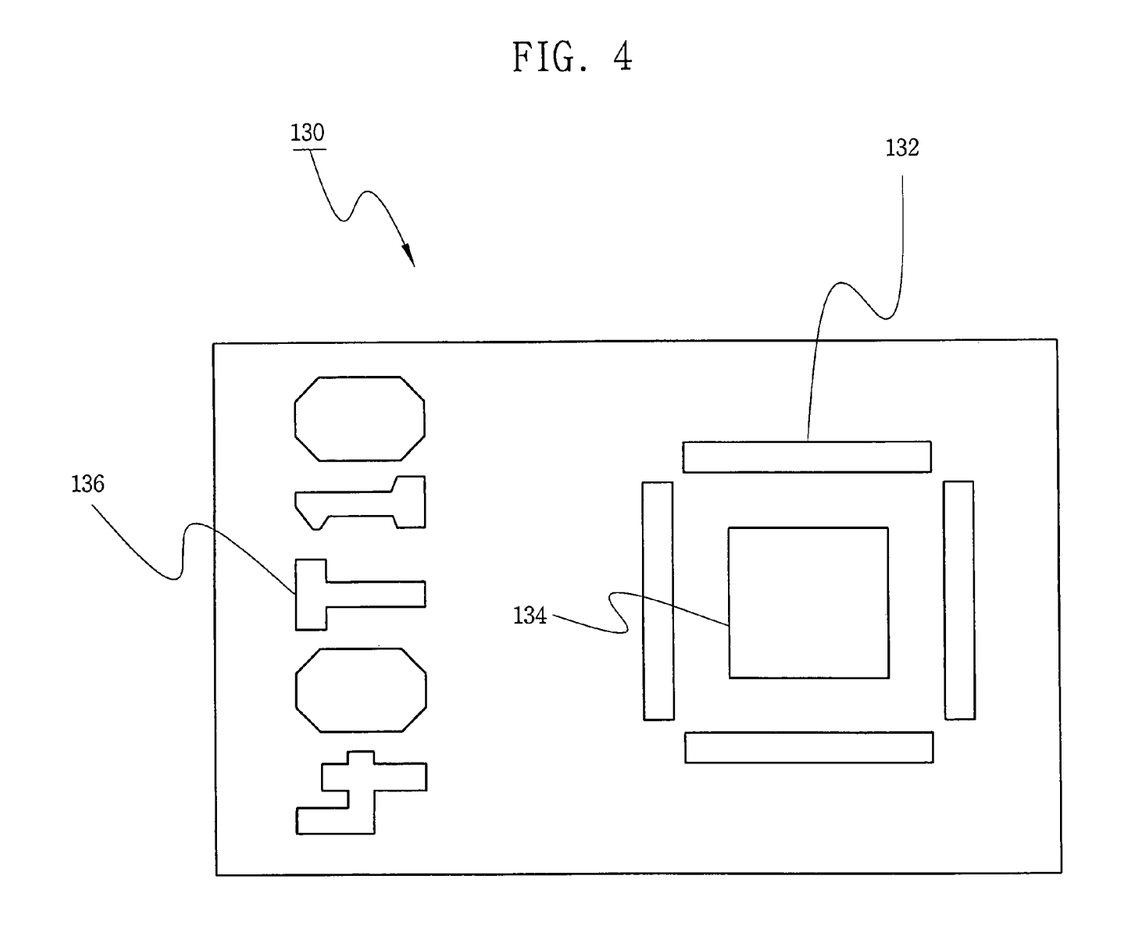
FIG. 4 shows an overlay mark comprising a label.
Figure 5:
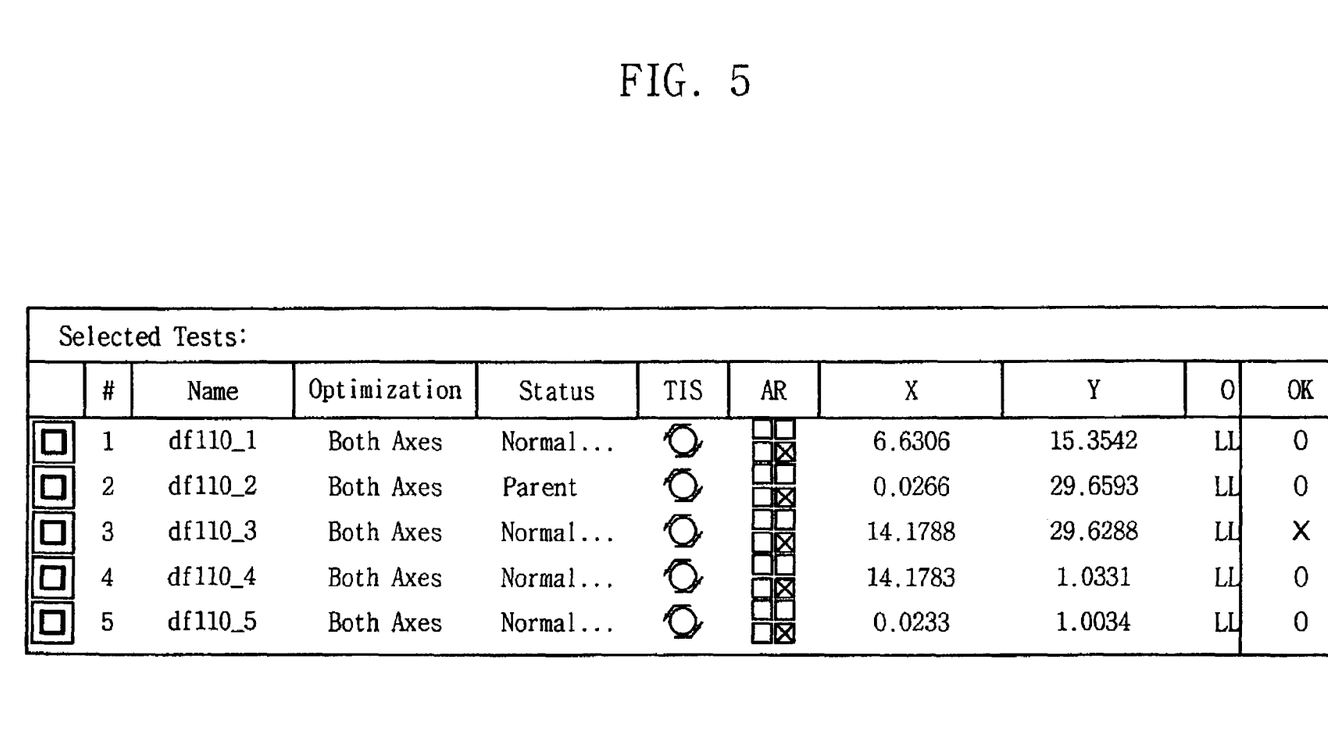
FIG. 5 shows a screen that displays positions of overlay marks.

FIG. 2 shows a flow chart of an overlay measuring method in accordance with an embodiment of the invention. FIG. 3 shows a screen that is displayed on an output unit of an apparatus computer when setting up a map when performing the method of FIG. 2. FIG. 4 shows an overlay mark comprising a label. FIG. 5 shows a screen that displays measured positions of overlay marks.

Referring to FIGS. 1 and 2, host computer 120 provides a reference recipe to measuring apparatus computer 110 (S100). That is, host computer 120 outputs a reference recipe to be used in making a preliminary overlay measurement to measuring apparatus computer 110. The reference recipe output by host computer 120 comprises information corresponding to a chip pattern formed in a reticle that was used as a pattern mask in an exposure unit to form a photoresist pattern that is formed on the wafer. The reference recipe may, for example, comprise figures or characters that define information corresponding to the kind and size of the chip patterns formed on the wafer and information corresponding to the respective shapes and positions of a wafer alignment mark formed proximate the chip pattern and a wafer overlay mark 130 formed within the chip pattern.

Measuring apparatus computer 110 sets the map corresponding to the wafer on which the preliminary overlay measuring process is performed, sets the map in accordance with the reference recipe, receives from host computer 120 or an operator a setup position for wafer overlay mark 130 relative to the position of a wafer alignment mark (i.e., a shot reference point), wherein the setup position is obtained from information about a reticle when the map is set up, and stores setup data comprising the setup position (S200). Measuring apparatus computer 110 uses a chip pattern image corresponding to information contained in the reference recipe to set the map so that the respective positions of a plurality of chip patterns formed on the wafer can be readily detected. The map is set such that the chip patterns are arranged in a radial pattern from the center of the wafer. As an example, about 77 (5×), 40, or 17 (25×) chip patterns may be formed on a single 8-inch wafer. The map represents position information for the chip patterns formed on the wafer, and a map is set for each wafer. Accordingly, the map is fundamental data required in the preliminary overlay measuring process that is performed on a wafer after a plurality of thin films formed on the wafer have been patterned.

The map is stored in the storage unit of measuring apparatus computer 110 and is output when needed. Setup data comprising the setup position for wafer overlay mark 130 may be input while the map is being set up in measuring apparatus computer 110. The setup data is based on reticle information and may be input to measuring apparatus computer 110 by an operator or by host computer 120. In addition, measuring apparatus computer 110 sets and stores the map prior to performing the preliminary overlay measuring process and outputs a control signal so that, when the preliminary overlay measuring process is performed, optical unit 105 of overlay measuring apparatus 100 can focus onto a predetermined position on the map to determine whether or not a particular (i.e., corresponding) thin film formed on the wafer has been patterned normally. Measuring apparatus computer 110 can, for example, set a map that is substantially the same as the map in FIG. 3, which is shown being output through an output unit.

FIG. 3 shows a screen that is displayed on an output unit of an apparatus computer when setting up a map. Referring to FIG. 3, an upper-left portion of the screen displays an image of a wafer overlapping with a plurality of chip pattern images. The upper-right portion of the screen illustrated in FIG. 3 is a first active screen in which initial values may be input while the map is being set up. The lower portion of the screen is a second active screen in which the setup data corresponding to the respective setup positions of a plurality of wafer overlay marks 130 may be input. Although not shown, a tool bar comprising hot keys or WINDOWS explorer may be displayed on an upper portion or a left-hand portion of the screen. Variables for which initial values are input when setting up the map for a wafer comprise Field Step Size, Die/Field, Orientation, Wafer Grid Shift Vector-R1, Wafer Type, Wafer Shape, Wafer Diameter, Wafer Thickness, and Edge Exclusion. "Field Step Size" corresponds to the size of a chip pattern image formed on the wafer. "Die/Field" corresponds to the sequential position in which the chip pattern image was shot by the exposure unit. "Orientation" corresponds to an orientation of a flat zone of the wafer (i.e., corresponds to the direction of the azimuth angle of the flat zone of the wafer). "Wafer Grid Shift Vector-R1" corresponds to coordinates indicating a distance from the center (i.e., central position) of the wafer to a predetermined position (e.g., a shot reference point) disposed on a boundary of a corresponding chip pattern image. "Wafer Type" corresponds to the wafer's type, "Wafer Shape" corresponds to the shape of the wafer, "Wafer Diameter" corresponds to the diameter of the wafer, and "Wafer Thickness" corresponds to the thickness of the wafer. "Edge Exclusion" corresponds to a value used in defining an edge region of the wafer on which no chip is formed.

As an example, when a chip pattern with a Field Step Size of about 17.12 mm in an X-axis direction and about 14.74 mm in a Y-axis direction is formed at a first "Die/Field" position (1, 1) in X-axis and Y-axis directions, respectively, from the center of a circular wafer having a diameter of about 200 mm and an orientation of 270° (i.e., oriented such that the flat zone of the wafer is substantially parallel to the Y-axis), the Wafer Grid Shift Vector-R1 is set at a position located at about 17.09433 mm in X-axis direction and about 9.7336 mm in Y-axis direction from the center of the wafer. The shot reference point corresponding to the predetermined position on the boundary of the chip pattern image may be defined as a reference point having coordinates (0, 0), and a cross-shaped wafer alignment mark (i.e., a "+"-shaped wafer alignment mark) may be formed on the shot reference point. The shot reference point (and thus the wafer alignment mark) may also be formed on a scribe line disposed at a lower-left (LL) portion of the chip pattern. The chip pattern image has a rectangular shape in which the width of the chip pattern image (i.e., the width in an X-axis direction) is longer than the length of the chip pattern image (i.e., the length in a Y-axis direction). In addition, five overlay marks 130 are formed on scribe areas adjacent to the center of and corners of the chip pattern, respectively.

A lower portion of the screen of FIG. 3 is a second active screen displaying setup data that is based on reticle information and that corresponds to respective setup positions for a plurality of wafer overlay marks 130. The setup data of the second active screen of FIG. 3 is input and displayed when setting up the map. Referring to FIG. 3, "TEST#" indicates the index assigned to a particular wafer overlay mark 130 formed on a chip pattern. For each value of "TEST#" (i.e., for each wafer overlay mark 130), "X" and "Y" indicate a setup position (i.e., an accurate position) of the corresponding wafer overlay mark 130 as X-axis and Y-axis coordinates, respectively, wherein the position of the wafer alignment mark (i.e., the shot reference point) is defined as (0, 0) and the setup position is based on reticle information. "Allowance" comprises upper and lower limits (i.e., an "Upper Limit" and a "Low Limit", respectively) that are used to determine whether or not, once measured, the measured position of a corresponding wafer overlay mark 130 that is to be evaluated subsequently in an overlay evaluation process falls within a predetermined range defined around the setup (i.e., accurate) position of the wafer overlay mark 130, wherein the setup position is based on reticle information.

In the example illustrated in FIG. 3, TEST# 1 indicates the position of a wafer overlay mark 130 formed at the center of a first chip pattern, which is rectangular. TEST# 2 indicates the position of a wafer overlay mark 130 formed at an upper-left (UL) corner of the first chip pattern, TEST# 3 indicates the position of a wafer overlay mark 130 formed at an upper-right (UR) corner of the chip pattern, TEST# 4 indicates the position of a wafer overlay mark 130 formed at a lower-right (LR) corner of the chip pattern, and TEST# 5 indicates the position of a wafer overlay mark 130 formed at a lower-left (LL) corner of the chip pattern. Also, overlay marks 130 corresponding to TEST#s 1 through 5 are disposed at coordinates the (6.6317, 15.3550), (0.0244, 29.6492), (14.1785, 29.6492), (14.1785, 1.0217), and (0.0244, 1.0217), respectively. The preceding coordinate pairs are in the form (X-coordinate, Y-coordinate), in which the X-coordinate indicates the distance in the X-axis direction by which the corresponding wafer overlay mark 130 is separated from the wafer alignment mark (i.e., the shot reference point), which is disposed at a point having the coordinates (0, 0). In addition, the Y-coordinate indicates the distance in the Y-axis direction that the corresponding wafer overlay mark 130 is separated from wafer alignment mark. An allowable range of about ±0.0200 mm is set for each coordinate of the setup position for each wafer overlay mark 130. That is, for each coordinate in each coordinate pair, the upper limit is about 0.0200 mm greater than the coordinate and the lower limit is about 0.0200 mm less than the coordinate. The coordinates are represented in units of mm.

Accordingly, the overlay measuring method, in accordance with an embodiment of the invention comprises, setting up the map, which comprises inputting setup data to measuring apparatus computer 110, wherein the setup data comprises setup positions of wafer overlay marks 130 that are based on reticle information. The overlay measuring method further comprises comparing the setup data with measurement data, wherein the measurement data is obtained by taking measurements using the optical unit and the measurement data is input to measuring apparatus computer 110. In addition, if a measured position for a wafer overlay mark 130 of the measurement data is outside of an allowable range around the setup position corresponding to that wafer overlay mark 130 in the setup data, then the overlay measuring method outputs an interlock control signal to prevent the overlay evaluation process from performing an overlay evaluation process using the current measurement data. Accordingly, it is possible to reduce the amount of erroneous results produced by the overlay evaluation process (i.e., reduce overlay measurement errors) and improve the productivity of a semiconductor device fabrication process.

Next, a preliminary overlay measuring process is performed through the optical unit of overlay measuring apparatus 100, wherein measuring apparatus computer 110 controls optical unit 105. Optical unit 105 moves to a location proximate the center of the wafer and the wafer alignment mark (i.e., shot reference point) in accordance with the map that is output from measuring apparatus computer 110 and magnifies a wafer overlay mark 130. For example, the preliminary overlay measuring process is performed by arranging a wafer on the wafer stage of overlay measuring apparatus 100, measuring the position of the center of the wafer using optical unit 105, and measuring the position of the wafer alignment mark, which is disposed on a shot reference point and on a boundary of the chip pattern and is separated from the central position of the wafer by a predetermined distance.

When the wafer is arranged on the wafer stage in a particular orientation (i.e., direction) based on a flat zone or a notch formed on the wafer, measuring apparatus computer 110 recognizes the center (i.e., central position) of the wafer and measures the position of the center of the wafer using optical unit 105 (S300). Measuring apparatus computer 110 can recognize and measure the central position of the wafer while matching the wafer image taken through the optical unit with the wafer image on the map. As an example, a lens of optical unit 105 can focus on the center of the wafer so that a pattern with a size of about 12 mm formed on the wafer can be magnified and projected up to a predetermined size.

Using optical unit 105, measuring apparatus computer 110 recognizes and measures the position of a wafer alignment mark that is separated by a predetermined distance from the center position of the wafer and is formed on a scribe line at a boundary of a chip on the wafer (S400) and thereby recognizes and measures the position of a shot reference point on which the wafer alignment mark is formed. Measuring apparatus computer 110 uses optical unit 105 to recognize the wafer alignment mark formed on the wafer by comparing received images of the wafer with the image of the wafer alignment mark in the map, and measures the position of the wafer alignment mark, thereby measuring the position of the shot reference point on which the wafer alignment mark is formed. For example, a lens of optical unit 105 is controlled to move its focus in a horizontal direction from the center of the wafer to a position at which the wafer alignment mark is formed while maintaining a predetermined magnification to magnify and project a pattern having a size of about 12 mm, wherein optical unit 105 is also capable of magnifying and projecting the wafer alignment mark having a size of about 750 µm.

According to the overlay measuring method in accordance with an embodiment of the invention, when the preliminary overlay measuring process is being performed, measuring apparatus computer 110 uses optical unit 105 to recognize and measure the center (i.e., central position) of the wafer, and to recognize and measure the wafer alignment mark formed on the shot reference point. The preliminary overlay measuring process is performed on a wafer when a plurality of thin films formed on the wafer have been patterned.

An operator then inputs measurement data comprising the measured position of a wafer overlay mark 130 that is separated by a predetermined distance from the wafer alignment mark (i.e., the shot reference point) (S500). The position of wafer overlay mark 130 may not always be the same (i.e., uniform) when a plurality of thin films formed on a wafer are patterned, so the position of wafer overlay mark 130 cannot be stored and used repeatedly. Accordingly, new measurement data (e.g., a new recipe) is set and stored in measuring apparatus computer 110 during a preliminary overlay measuring process (i.e., at an early stage of the overlay measuring method) that is performed after the last thin film on which a portion of wafer overlay mark 130 is formed has been patterned. That is, new measurement data is stored during the preliminary overlay measuring process of the overlay measuring method. In addition, measuring apparatus computer 110 is controlled to use the measurement data to locate the position of the same wafer overlay mark 130 during a subsequent overlay evaluation process. As shown in FIG. 4, wafer overlay mark 130 comprises a mother ruler 132, a son ruler 134, and a label 136. Mother ruler 132 is patterned on the thin film in a first process, and son ruler 134 is patterned on a mask such as a photoresist layer by a second process performed after the first process. Label 136 is separated from mother ruler 132 and son ruler 134 in a direction that is substantially parallel to a working surface of the wafer on which they are formed, and label 136 indicates information concerning wafer overlay mark 130.

As illustrated in FIG. 4, mother ruler 132 comprises four bar-shaped portions forming four sides of a rectangle, and son ruler 134 has the shape of a rectangle and is disposed inside of mother ruler 132. Alternatively, mother ruler 132 may have the shape of a rectangle and son ruler 134 may comprise four bar-shaped portions forming four sides of a rectangle. The center of mother ruler 132 and the center of son ruler 134 are used to calculate an overlay compensation value. Ideally, the respective centers of mother ruler 132 and son ruler 134 should each have substantially the same position. The center of mother ruler 132 is the center of the rectangle formed by the bar-shaped portions of mother ruler 132. However, the centers may not have substantially the same position due to slight changes in the semiconductor fabrication process, and particularly in the exposure process.

Label 136 comprises information about the thin films on which mother ruler 132 and son ruler 134 are patterned. For example, a label "40 TO 10" ("40T10" in FIG. 4) indicates that a current thin film on which son ruler 134 is patterned, and which is exposed by a photoresist pattern, is the fourth film formed on the wafer, and that a previously-formed thin film on which mother ruler 132 is patterned is the first film formed on the wafer. Wafer overlay mark 130 can be designed and patterned in various forms within the chip pattern area of the wafer so that an overlay compensation value between a plurality of thin films formed on the wafer can be calculated.

In order to calculate the overlay compensation value between the thin films from a specific wafer overlay mark 130 among various kinds of wafer overlay marks 130 that are patterned within a single chip pattern, measuring apparatus computer 110 needs the coordinates of the position of the specific wafer overlay mark 130, which are obtained during the preliminary overlay measuring process. Accordingly, an operator selects a specific wafer overlay mark 130 and inputs measurement data comprising a measured position for the specific wafer overlay mark 130 through a screen of the output unit using information concerning an image of the surface of the wafer that is provided from the optical unit to measuring apparatus computer 110. The optical unit is controlled by measuring apparatus computer 110 so that it can magnify and project the wafer overlay mark 130 having a size of about 50 μm and which is separated from the wafer alignment mark by a predetermined distance.

As an example, an operator may view an image of wafer overlay mark 130 displayed on a screen of the output unit and click on the center of son ruler 134 or mother ruler 132 to input measurement data for wafer overlay mark 130 to measuring apparatus computer 110. Measuring apparatus computer 110 may store measurement data comprising the coordinates for the position of wafer overlay mark 130 relative to the wafer alignment mark (i.e., the shot reference point) from which it is separated.

Measuring apparatus computer 110 compares the measurement data, which is obtained in accordance with an operator's input, with the setup data (S600), which is input when the map is set up, and then determines whether the measured position of wafer overlay mark 130 of the measurement data is equal to or within the allowable range of the setup position of the setup data (S700). For example, measuring apparatus computer 110 may compare measured positions of wafer overlay marks 130, as shown in FIG. 5, with setup positions and corresponding allowable ranges of wafer overlay marks 130, which are input as shown in FIG. 3. The respective centers of wafer overlay marks 130 are represented by pairs of X-axis and Y-axis coordinates so that the measurement data output to the output unit of measuring apparatus computer 110 can be compared with the setup data. The measured and setup positions of each wafer overlay mark are compared in order in accordance with the "TEST#" indices that corresponds to each of the measured and setup positions (see FIGS. 3 and 5). As used herein, the "center" of a wafer overlay mark 130 is the center of at least one of mother ruler 132 and son ruler 134 of wafer overlay mark 130.

Referring to FIG. 5, the symbol "#" stands for "TEST#" which denotes a column of indices corresponding to measured positions of wafer overlay marks 130, respectively, and the indices of the TEST# column give the measured positions of FIG. 5 an order corresponding to the order of the setup positions of FIG. 3, which is indicated by the indices of the TEST# column of FIG. 3. Still referring to FIG. 5, "Name" denotes a specific magnification index for the optical unit, and "Optimization" indicates the number of reference axes on a coordinate plane that are used to indicate the measured coordinate of the center of a corresponding wafer overlay mark 130. In addition, "Status" indicates whether a predetermined condition is independent or dependent upon the measurement of the corresponding wafer overlay mark 130. "TIS" stands for Tool Induced Shift and indicates that a corresponding wafer overlay mark 130 was measured at angles of 0° and 180°. Also, "AR" stands for "area" and indicates the relative position, among four adjacent chips, of the chip in which the corresponding measured wafer overlay mark 130 is disposed. "X" and "Y" indicate X-axis and Y-axis coordinates, respectively, of the corresponding measured wafer overlay mark 130. That is, "X" and "Y" indicate the coordinates of the measured position of the corresponding wafer overlay mark 130. Values in the "0" field indicate what portion of a chip pattern the shot reference point is adjacent to (e.g., the lower-left portion (LL)), wherein the corresponding wafer overlay mark 130 is disposed in that chip pattern.

For example, the wafer overlay mark 130 that has an index of 1, which is disposed at the center of a chip pattern, has been measured to be separated from the wafer alignment mark (i.e., a shot reference point) by about 6.6306 mm in X-axis direction and about 15.3542 mm in Y-axis direction, wherein the wafer alignment mark, which is formed on the shot reference point, is adjacent to the chip pattern. Wafer overlay mark 130 was measured in overlay measuring apparatus 100, wherein overlay measuring apparatus 100 was controlled such that an optical unit of overlay measuring apparatus 100 had a focal point corresponding to the Name "df110_1". The X-axis and the Y-axis are the axes that correspond to the "Both Axes" value in the "Optimization" field (i.e., column). Measuring apparatus computer 110 compares measurement data corresponding to a specific index value with setup data corresponding to the same index value and determines whether or not the measured position of a wafer overlay mark 130 of that measurement data is acceptable (i.e., normal) when compared to the setup position of wafer overlay mark 130 of the setup data. For example, measuring apparatus computer 110 may determine whether or not each coordinate of the measured position of wafer overlay mark 130 is between the upper and lower limits of the corresponding coordinate of a setup position corresponding to the measured position.

If the measured position of the measurement data is equal to or falls within an allowable range (i.e., falls between the lower limit and upper limit) of the setup position, measuring apparatus computer 110 can set the measurement data as a measurement recipe, store it in the storage unit, and use it to perform a subsequent overlay evaluating process (S800). Referring to FIGS. 3 and 5, the measurement data for wafer overlay marks 130 corresponding to indices 1, 2, 4, and 5 is acceptable (i.e., normal) because each coordinate of the measured positions of the wafer overlay marks 130 corresponding to those indices (see FIG. 5) are between the upper and lower limits corresponding to those coordinates in the setup data (see FIG. 3). Thus, in FIG. 5, a field "OK" has a value of "0" for wafer overlay marks 130 corresponding to indices 1, 2, 4, and 5, indicating that the measurement data for those wafer overlay marks 130 is acceptable. However, the wafer overlay mark 130 corresponding to index 3 is not acceptable (i.e., not normal) because, while the X-axis coordinate of the measured position (see FIG. 5) is between the upper and lower limits for the X-axis coordinate of the setup data corresponding to index 3 (see FIG. 3), the Y-axis coordinate of the measured position (see FIG. 5) is outside of the upper and lower limits (in this case, below the lower limit) for the Y-axis coordinate of the setup data corresponding to index 3 (see FIG. 3). Thus, in FIG. 5, the field "OK" has a value of "X" for the wafer overlay mark 130 corresponding to index 3, indicating that the measurement data the wafer overlay marks 130 corresponding to index 3 is not acceptable.

When a measured position of the measurement data is not within the allowable range of the corresponding setup position of the setup data, measuring apparatus computer 110 outputs an interlock control signal to the overlay measuring apparatus 100 so that an overlay evaluation process will not be performed based on the measurement data (S900). When it is determined that a measured position of the measurement data is not within the allowable range of the corresponding setup position of the setup data, measuring apparatus computer 110 outputs a control signal causing the display unit to display the wafer overlay mark 130 having overlay measurement errors (i.e., the wafer overlay mark 130 having a measured position outside of the allowable range) and displays (i.e., indicates) that the overlay evaluation process was not performed using the measurement data. Also, the display unit displays the measured position of the wafer overlay mark 130 for which the measured position was outside of the allowable range. Then, the operator releases the interlock control signal that is output from measuring apparatus computer 110 and a portion of the preliminary overlay measuring process is performed again on the wafer overlay mark 130 for which it was determined that the coordinates of the measured position were not within the allowable range in order to input new measurement data comprising a new measured position of the wafer overlay mark 130 to determine whether or not the measured position of the wafer overlay mark 130 input to measuring apparatus computer 110 through the previous preliminary overlay measurement process was input incorrectly. That is, when the interlock control signal is output from the measuring apparatus computer, inputting new measurement data comprising a new measured position of the wafer overlay mark to measuring apparatus computer 110 is performed. In addition, when it is determined that the measurement data was correctly input in the previous preliminary overlay measurement process (i.e., determines that the measurement data is constant or normal), the operator can determine whether or not the setup data input based on reticle information is correct (i.e., normal).

The overlay measuring method, in accordance with an embodiment of the invention, can reduce inaccurate overlay evaluation. The overlay measuring method comprises inputting setup data corresponding to the position of a wafer overlay mark 130 to measuring apparatus computer 110 based on reticle information when a map is set up, inputting to measuring apparatus computer 110 measurement data comprising a measured position of wafer overlay mark 130, and comparing the measured position with the setup data using measuring apparatus computer 110 to determine whether or not the measured position falls within a corresponding allowable range in the setup data. The method further comprises outputting an interlock control signal so that an overlay evaluation process will not use the measurement data if a measured position in the measurement data is not within the corresponding allowable range of a setup position of the setup data.

Although embodiments of the invention have been described herein, modifications may be made to the embodiments by one of ordinary skill in the art without departing from the scope of the invention as defined by the accompanying claims.

What is claimed is:

1. An overlay measuring method comprising:
    setting a map corresponding to a wafer using a measuring apparatus computer and a reference recipe output from a host computer;
    inputting setup data comprising a setup position and an allowable range corresponding to the setup position to the measuring apparatus computer, wherein the setup position is obtained from reticle information;
    recognizing and measuring a position of a center of the wafer using an optical unit connected to the measuring apparatus computer;
    recognizing and measuring a position of a wafer alignment mark using the optical unit, wherein the wafer alignment mark is formed on a boundary of a plurality of chips formed on the wafer and the position of the center of the wafer and the position of the wafer alignment mark are defined relative to the map;
    inputting measurement data comprising a measured position of a wafer overlay mark to the measuring apparatus computer, wherein the wafer overlay mark is separated from the wafer alignment mark;
    comparing the measurement data with the setup data; and,
    outputting an interlock control signal from the measuring apparatus computer if the measured position of the wafer overlay mark is outside of the allowable range,
    wherein the setup position corresponds to a position of a reticle overlay mark formed in a reticle of an exposure unit and comprises a first coordinate corresponding to a first axis and a second coordinate corresponding to a second axis;
    the setup position is defined relative to a position of a reticle alignment mark formed in the reticle; and, the allowable range is defined by first and second upper limits corresponding to the setup position and first and second lower limits corresponding to the setup position, wherein the first upper limit and the first lower limit each correspond to the first axis in a coordinate plane, and the second upper limit and the second lower limit each correspond to the second axis in the coordinate plane and orthogonal to the first axis, wherein: the first upper limit is about 0.02 mm greater than the first coordinate and the first lower limit is about 0.02 mm less than the first coordinate; and the second upper limit is about 0.02 mm greater than the second coordinate and the second lower limit is about 0.02 mm less than the second coordinate.

2. A management system for semiconductor fabrication equipment comprising:

an overlay measuring apparatus adapted to perform an overlay evaluation process to calculate a compensation value for a wafer overlay mark formed on a wafer and adapted to measure a position of the wafer overlay mark;

a host computer comprising a database and adapted to output from the database information used in controlling the overlay measuring apparatus; and, a measuring apparatus computer electrically connected between the host computer and the overlay measuring apparatus and adapted to compare the measured position of the wafer overlay mark with setup data and output an interlock control signal if the measured position of the overlay mark is outside of an allowable range, wherein:

the setup data comprises a setup position including a first coordinate corresponding to a first axis and a second coordinate corresponding to a second axis and the allowable range, wherein the allowable range is defined by first and second upper limits corresponding to the setup position and first and second lower limits corresponding to the setup position, the first upper limit and the first lower limit each correspond to the first axis in a coordinate plane, and the second upper limit and the second lower limit each correspond to the second axis in the coordinate plane and orthogonal to the first axis, and the first upper limit is about 0.02 mm greater than the first coordinate and the first lower limit is about 0.02 mm less than the first coordinate, and the second upper limit is about 0.02 mm greater than the second coordinate and the second lower limit is about 0.02 mm less than the second coordinate; and the setup position is based on reticle information and is received from the host computer or an operator.

3. An overlay measuring method comprising:

outputting a reference recipe from a host computer;

using a measuring apparatus computer to set a map corresponding to a wafer using the reference recipe received from the host computer;

inputting setup data comprising a setup position and an allowable range corresponding to the setup position to the measuring apparatus computer, wherein the setup position is obtained from reticle information;

aligning the wafer on a wafer stage of an overlay measuring apparatus comprising an optical unit;

recognizing and measuring a position of a center of the wafer defined relative to the map using the optical unit;

recognizing and measuring a position of a wafer alignment mark formed on a boundary of a first plurality of chips formed on the wafer and disposed proximate the center of the wafer;

inputting measurement data comprising a measured position of a wafer overlay mark to the measuring apparatus computer, wherein the wafer overlay mark is separated from the wafer alignment mark;

comparing the measurement data with the setup data; and, outputting an interlock control signal from the measuring apparatus computer if the measured position of the wafer overlay mark is outside of the allowable range, wherein setting the map comprises setting an initial value for at least each of the following: a size of a chip pattern image of a chip of the first plurality of chips, a sequential position in which the chip pattern image was shot by an exposure unit, an orientation of a flat zone of the wafer, coordinates indicating a distance from the center of the wafer to a position on a boundary of the chip pattern image, a type, shape, and diameter of the wafer, and a value used in defining an edge region of the wafer where no chip is formed.

4. The method of claim 3, wherein the wafer alignment mark is located at a same position as a shot reference point disposed on a boundary of the first plurality of chips and is disposed on a scribe line disposed at a lower-left portion of the first plurality of chips.

5. The method of claim 3, wherein measuring the position of the center of the wafer comprises magnifying and projecting a pattern having a size of 12 mm formed on the wafer.

6. The method of claim 3, wherein measuring the position of the wafer alignment mark using the optical unit comprises using the optical unit to magnify and project a pattern having a size of 750 μm.

7. The method of claim 3, wherein measuring the position of the wafer overlay mark comprises using the optical unit to magnify and project a pattern having a size of 50 μm.

8. The method of claim 3, wherein the measurement data comprises:

an index corresponding to the wafer overlay mark; and, coordinates for the position of the wafer overlay mark on a two-dimensional coordinate plane.

9. The method of claim 3, further comprising setting the measurement data as a measurement recipe adapted for use in an overlay measuring process if the measured position of the wafer overlay mark is within the allowable range.

10. The method of claim 3, further comprising:

when the interlock control signal is output from the measuring apparatus computer:

displaying the measured position of the wafer overlay mark on a display unit; and, displaying an indication that an overlay evaluation process was not performed using the measurement data.

11. The method of claim 3, further comprising inputting new measurement data comprising a new measured position of the wafer overlay mark to the measuring apparatus computer when the interlock control signal is output from the measuring apparatus computer.

12. The method of claim 3, wherein:

the setup position corresponds to a position of a reticle overlay mark formed in a reticle of the exposure unit;

the setup position is defined relative to a position of a reticle alignment mark formed in the reticle; and, the allowable range is defined by first and second upper limits corresponding to the setup position and first and second lower limits corresponding to the setup position, wherein the first upper limit and the first lower limit each correspond to a first axis in a coordinate plane, and the second upper limit and the second lower limit each correspond to a second axis in the coordinate plane and orthogonal to the first axis.

13. The method of claim 12, wherein:
the setup position comprises a first coordinate corresponding to the first axis and a second coordinate corresponding to the second axis;
the first upper limit is about 0.02 mm greater than the first coordinate and the first lower limit is about 0.02 mm less than the first coordinate; and, the second upper limit is about 0.02 mm greater than the second coordinate and the second lower limit is about 0.02 mm less than the second coordinate.

* * * * *